(12) United States Patent
Liposcak

(10) Patent No.: US 6,365,284 B1
(45) Date of Patent: Apr. 2, 2002

US006365284B1

(54) FLEXIBLE SOLAR-CONTROL LAMINATES

(75) Inventor: Curtis J. Liposcak, Madison, WI (US)

(73) Assignee: Crown Operations International, Ltd., Sun Prairie, WI (US)

(*) Notice: Subject to any disclaimer, the term of this patent is extended or adjusted under 35 U.S.C. 154(b) by 0 days.

(21) Appl. No.: 09/326,034

(22) Filed: Jun. 4, 1999

(51) Int. Cl.[7] .............................................. B32B 27/42
(52) U.S. Cl. ........................ 428/621; 156/90; 156/99; 204/192.27; 359/360; 359/361; 427/402; 427/404; 427/407.1; 427/419.2; 427/419.1; 427/419.7; 428/336; 428/460; 428/642; 428/622; 428/623; 428/626; 428/627; 428/632; 428/673; 428/926; 428/436; 428/437
(58) Field of Search ................................ 428/524, 626, 428/629, 642, 668, 621, 336, 460, 622, 623, 627, 632, 673, 926, 436, 437; 427/402, 404, 407.1, 419.2, 419.1, 419.7; 204/192.27; 359/360, 361; 156/90, 99

(56) References Cited

U.S. PATENT DOCUMENTS

| | | | |
|---|---|---|---|
| 4,413,877 A | 11/1983 | Suzuki et al. ................ 359/360 |
| 4,462,883 A | 7/1984 | Hart ....................... 204/192.26 |
| 4,488,775 A | 12/1984 | Yamamoto .................... 359/588 |
| 4,497,700 A | 2/1985 | Groth et al. ............ 204/192.27 |
| 4,504,109 A | 3/1985 | Taga et al. .................. 359/359 |
| 4,546,050 A | 10/1985 | Amberger et al. ........... 428/630 |
| 4,548,691 A | 10/1985 | Dietrich et al. ........ 204/192.27 |
| 4,799,745 A | 1/1989 | Meyer et al. ................ 359/360 |
| 4,828,346 A | 5/1989 | Jacobson et al. ............ 359/360 |
| 4,834,857 A | 5/1989 | Gillery ................... 204/192.27 |
| 4,847,158 A | 7/1989 | Gillery ....................... 428/433 |
| 4,891,113 A | 1/1990 | Criss ..................... 204/192.15 |
| 4,973,511 A | 11/1990 | Farmer et al. .............. 428/216 |
| 5,059,295 A | 10/1991 | Finley ................... 204/192.27 |
| 5,071,206 A | 12/1991 | Hood et al. .................. 359/360 |
| 5,201,926 A | 4/1993 | Szczyrbowksi et al. ....... 65/60.2 |
| 5,279,722 A | 1/1994 | Szczyrbowski et al. ... 204/192.27 |
| 5,494,743 A | 2/1996 | Woodard et al. ............ 428/336 |
| 5,529,848 A | * 6/1996 | D'Errico ..................... 428/436 |
| 5,563,734 A | 10/1996 | Wolfe et al. ................ 359/360 |
| 5,579,162 A | 11/1996 | Bjornard et al. ............ 359/580 |
| 5,584,902 A | 12/1996 | Hartig et al. ................. 65/32.4 |
| 5,589,280 A | 12/1996 | Gibbons et al. ............ 428/626 |

OTHER PUBLICATIONS

Berning, Peter H. (1983) "Principles of design of architectural coatings," *Applied Optics* 22(24) :4127–4141; Dec. 1983.

* cited by examiner

*Primary Examiner*—Robert R. Koehler
(74) *Attorney, Agent, or Firm*—Joseph T. Leone, Esq.; DeWitt Ross & Stevens S.C.

(57) ABSTRACT

Disclosed are compositions of matter which include a thin metallic and/or metallic oxide, nitride, carbide, silicide, boride, or sulfide coating disposed directly upon a polymeric substrate, in the absence of a carrier layer for the thin coating. Also disclosed are methods to make the composition and an apparatus to practice the method.

15 Claims, 1 Drawing Sheet

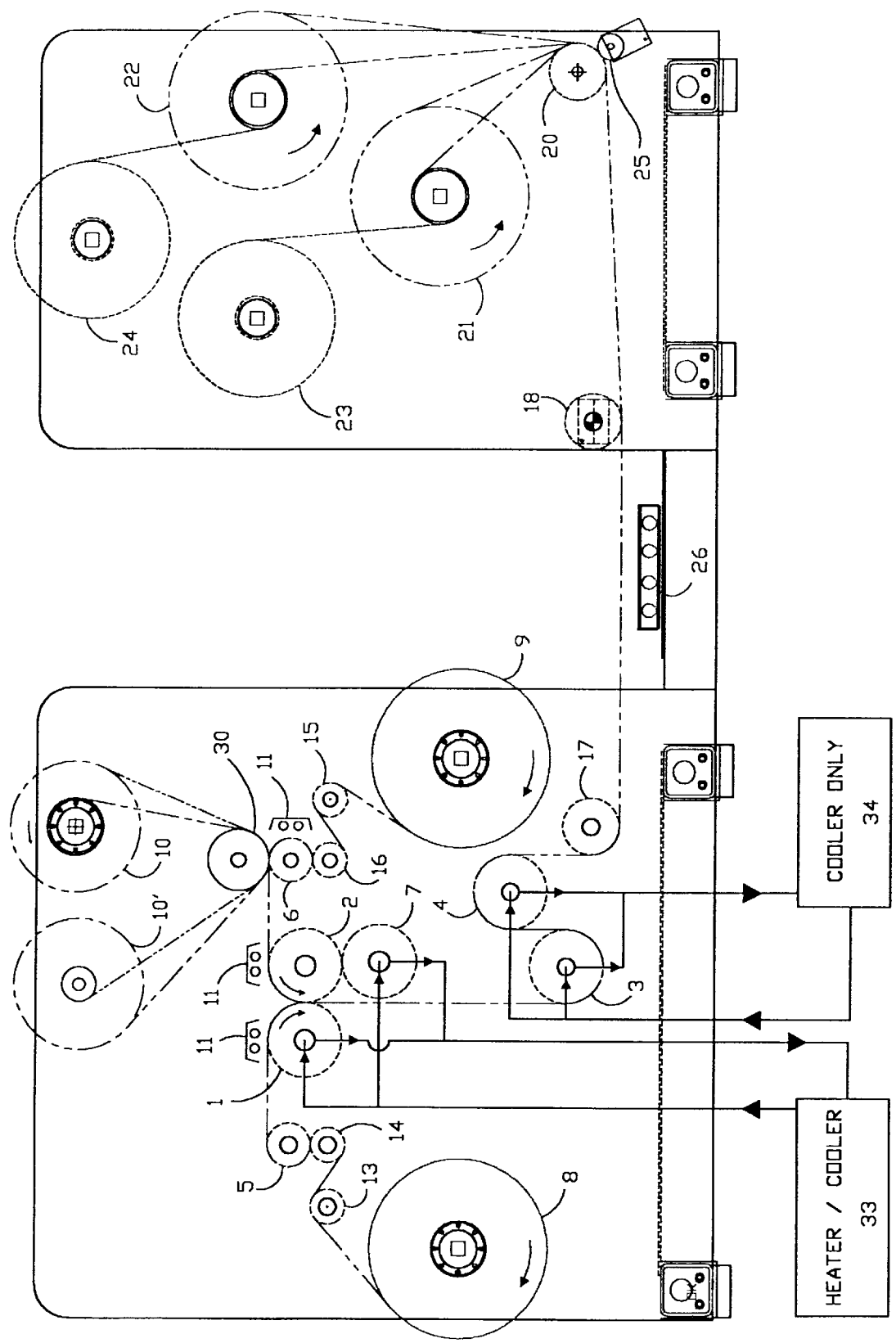

FLEXIBLE SOLAR-CONTROL LAMINATES

FIELD OF THE INVENTION

The present invention is directed to compositions of matter comprising a thin metallic and/or metal alloy and/or metallic oxide, nitride, carbide, silicide, boride, and/or sulfide single or multi-layer coating disposed directly upon a non-polyethylene terephthalate substrate ("non-PET substrate") substrate in the absence of a carrier sheet. The preferred embodiment of the invention is a prelaminate comprising a solar-control coating deposited upon a flexible, non-PET substrate, such as polyvinylbutyral (PVB), in the absence of a carrier sheet for the coating; a method for making the prelaminate; and a laminating machine for producing the laminate.

BRIEF DESCRIPTION OF THE PRIOR ART

Impact-resistant glasses, such as those used in automobile windshields, large aquariums, skylights, window-clad buildings, and the like, generally consist of one or more layers of a polymeric material (an "interlayer") laminated between two or more layers of glass. The interspersed polymeric layer functions to absorb and disperse forces which impact upon the glass, thereby providing increased impact resistance to the glass. In the event the glass laminate does break from an impact, the interspersed polymer interlayer binds the shards together so that while the glass may break or otherwise fail from an extreme impact, the glass will not shatter.

As used herein, the term "prelaminate" is used specifically to designate polymeric laminates whose generally intended use is to be incorporated into a finished laminated glass product. (Of course, the actual end use of the "prelaminates" fabricated by the invention described herein has no bearing on the scope of the present invention.) Therefore, as used herein, the term "prelaminate" means a laminate comprised of one or more polymeric layers (being of the same or different polymeric material) having deposited thereon or therebetween a thin metallic and/or metal alloy, and/or metallic oxide, nitride, carbide, silicide, boride, and/or sulfide coating. Preferably, the coating is a solar-control coating. Although the composition is, of course, still a laminate, the term "prelaminate" is used in this fashion because the glass industry customarily uses the noun "laminate" to refer to a finished glass product itself (as opposed to any other laminated product which might be incorporated in the finished glass product).

In recent years, interlayers have come to incorporate not only shatter-resistant properties, but also solar-control properties. Solar-reflecting window assemblies find use, for example, in automobile and architectural applications. In these uses, there is a dual objective to be accomplished by the glass laminate: 1) to manage heat loads within an enclosed structure by reflecting a portion of the infrared wavelengths of the solar spectrum which cause heating; while 2) simultaneously maintaining good visible wavelength transmissibility. These coatings are generally referred to herein as "solarcontrol coatings." In general, most solar-control coatings consist of a series of thin metal and/or metal oxide layers deposited upon a flexible, optically clear substrate, most commonly PET, or deposited directly onto a glass substrate. Numerous solarcontrol coatings of varying composition and construction are described in the patent literature. See, for instance, U.S. Pat. No. 4,413,877 to Suzuki et al.; U.S. Pat. No. 4,462,883 to Hart; U.S. Pat. No. 4,488,775 to Yamamoto; U.S. Pat. No. 4,497,700 to Groth et al.; U.S. Pat. No. 4,504,109 to Taga et al.; U.S. Pat. No. 4,546,050 to Amberger et al.; U.S. Pat. No. 4,548,691 to Dietrich et al.; U.S. Pat. No. 4,799,745 to Meyer et al.; U.S. Pat. No. 4,828,346 to Jacobson et al. U.S. Pat. No. 4,834,857 to Gillery; U.S. Pat. No. 4,847,158 to Gillery; U.S. Pat. No. 4,891,113 to Criss; U.S. Pat. No. 4,973,511 to Fanner et al.; U.S. Pat. No. 5,059,295 to Finley et al.; U.S. Pat. No. 5,071,206 to Hood et al.; U.S. Pat. No. 5,201,926 to Szczyrbowksi et al.; U.S. Pat. No. 5,279,722 to Szczyrbowski et al.; U.S. Pat. No. 5,494,743 to Woodard et al.; U.S. Pat. No. 5,563,734 to Wolfe et al.; U.S. Pat. No. 5,579,162 to Bjornard et al.; U.S. Pat. No. 5,584,902 to Hartig et al.; and U.S. Pat. No. 5,589,280 to Gibbons et al.

A significant problem encountered during the manufacture of conventional solar-control prelaminates is that the layer bearing the solar-control coating (most often PET) must be permanently bonded to the PVB layers without introducing any mechanical defects such as wrinkling, orange-peeling, etc. This is quite difficult owing to the vastly different physical characteristics of PET and PVB. To satisfy the demands of the laminated glass industry, a machine which fabricates solar-control prelaminates (or any other type of prelaminate to be incorporated into a glass laminate) must do so without introducing any mechanical defects in the prelaminate. Defects such as wrinkling in the prelaminate causes unacceptable optical defects in finished glass laminates containing the prelaminate. Adding to the problem is the fact that most of the defects in the prelaminate are not detectable until the prelaminate is incorporated into a laminated glass product. Only upon inspection of the laminated glass product are the defects in the prelaminate readily detectable, in which case the finished product must be rejected, thereby adding greatly to wastage.

Smoothly bonding PVB layers to a PET layer coated with a solar-control coating is very difficult and time-consuming because PVB (the plastic which provides impact resistance to the final glass laminate) is far more temperature-sensitive, and prone to stretch than is the interspersed coated PET film which provides solar control. Because of its extreme temperature sensitivity, PVB sheeting must be handled and worked at reduced temperatures. Even then, PVB sheeting is prone to blocking (i.e., sticking to itself when rolled onto a core). Consequently, prelaminates which incorporate PVB must also be handled at reduced temperatures prior to, during, and subsequent to processing to avoid blocking of the rolled product.

In the prior art laminates, solar-control coatings are described exclusively as being deposited upon an optically clear substrate, such as PET, which is far more stiff and more temperature-resistant than is PVB. However, the present inventors have discovered a means to apply a solar-control coating (virtually any type of solar-control coating) to a substrate, such as PVB, without having to incorporate a carrier sheet in the prelaminate product. Because the vast majority of the difficulties in manufacturing solar-control prelaminates arises during the bonding of a PET carrier sheet to a PVB layer, the present invention solves a long-felt need in the industry: a means to simplify the manufacture of solar-control prelaminates and simulteously reduce wastage. Because the prelaminates of the present invention do not require a carrier sheet bearing the solar-control coating to be incorporated into the prelaminate, a troublesome step in the manufacture of solar-control laminated glass products is eliminated by the present invention.

SUMMARY OF THE INVENTION

One aspect of the invention is directed to a solar-control prelaminate comprising a polymeric substrate, preferably PVB, containing directly thereon, and in the absence of a carrier sheet, a solar-control coating. The invention is also drawing to a polymeric substrate, preferably PVB, containing directly thereon a thin metallic and/or metal alloy, and/or metallic oxide, nitride, carbide, silicide, boride, and/or sulfide coating. The invention encompasses multilayer laminates and solarcontrol prelaminates containing the same.

Another aspect of the invention is directed to a solar-control prelaminate produced by depositing a solar-control coating upon a carrier sheet and then transferring the solar-control coating from the carrier sheet to a flexible substrate to yield a substrate having the solar-control coating contained directly thereon, without the presence of a carrier sheet. The substrate may then be bonded to other layers, if desired. In the same fashion, any thin metallic, metal alloy and/or metallic oxide, nitride, carbide, silicide, boride and sulfide coating can be deposited upon a carrier sheet and then transferred to the substrate, yielding a composition of matter which lacks a carrier sheet. The invention also encompasses multilayer solar-control prelaminates containing the same.

Yet another aspect of the invention is directed to a method of fabricating a composition of matter comprising a substrate, such as PVB, to which is directly bonded a thin metallic, metal alloy, and/or metallic oxide, nitride, carbide, silicide, boride or sulfide coating in the absence of a polymeric carrier sheet. The preferred substrate is PVB and the preferred coating is a solar-control coating. The method comprises depositing a thin metallic, metal alloy, and/or metallic oxide, nitride, carbide, silicide, boride or sulfide coating onto a carrier sheet and then transfering the coating from the carrier sheet to the substrate. This yields a substrate bearing a thin coating in the absence of a carrier sheet.

A still further aspect of the invention is an apparatus to carry out the above-noted process, thereby yielding the desired composition of matter.

The invention provides many advantages not found in the prior art. Foremost, the invention provides a solar-control prelaminate product which does not require the inclusion of a polythylene terephthalate carrier sheet. This is a distinct improvement over the prior art because mating a PVB sheet to a PET sheet is a difficult, time-consuming, and error-prone task. By eliminating the need to use a PET carrier sheet, the invention greatly eases the manufacture of solar-control prelaminates.

The invention also greatly improves the manufacture of any type of polymeric structure which must bear thin metal or metal-containing (i.e., metal oxides, nitrides, carbides, etc.) layers. In the prior art, these coatings were deposited upon a polymeric substrate which could withstand the rigors of magnetron sputtering, such as PET. The PET bearing the metal or metal-containing layer(s) would then be incorporated into the final laminated structure. In the present invention, the metal or metal-containing layer(s) are still deposited upon a carrier sheet which can withstand the rigors of magnetron sputtering; however, this carrier sheet is used solely as a carrier and is not incorporated into the final product. The carrier sheet bearing the metal layer(s) is then forced into contact with a substrate, such as PVB, and then separated from the substrate. This causes the metal layer(s) to release from the carrier sheet and adhere to the substrate. In this fashion, compositions of matter such as solar-control prelaminates can be fabricated without having to mate two substrates of different physical characteristics.

The invention is also drawn to a novel apparatus for manufacturing the new product. For purposes of brevity and clarity, the description of the invention which follows refers to a machine for the manufacture of a prelaminate product wherein the thin metallic and/or metal-containing coating is released from a PET carrier sheet and deposited upon a PVB substrate. This type of prelaminate best illustrates the problems which the present invention overcomes due to the vastly different physical characteristics displayed by PVB sheeting and PET sheeting. The invention is not limited to these substrates. The reader is invited to refer to the definitions provided below to grasp the full scope of the invention.

The invention can be used to fabricate any type of flexible, polymeric laminate wherein at least one thin metal-containing coating is disposed directly upon a polymeric sheet, such as PVB, without the presence of a carrier sheet, thereby yielding a uniform, wrinkle-free polymeric sheet having a metal-containing layer uniformly and directly contained thereon.

To deposit the metal-containing coating onto the PVB substrate so that the finished prelaminate will be suitable for use in laminated glass products, it is essential that the machine heats the PVB to a suitable temperature and applies a suitable unwind resistance to the PET carrier sheet bearing the coating to be deposited and to the PVB substrate during lamination to minimize wrinkles, ripples, orange-peeling, creep, curls, and to minimize the adverse effects of non-uniform thickness in the finished product. The balance between temperature and unwind resistance must be carefully controlled to limit stretch of the PVB substrate. This is done by utilizing a novel combination of resilient rollers (urethane or rubber) and steel rollers to apply the proper pressure during lamination and by infrared (IR) feedback for heater control and proportional tension control and proportional, integral, derivative (PID) speed control on the unwind and rewind.

Properly cooling the finished product is also essential for shipping the product rolled onto a core. PVB laminates are typically shipped either as a sheet or as a roll. If shipped as a roll, the rolled product must either be refrigerated constantly to prevent blocking, or the rolled PVB product must be interleaved with a release layer to prevent blocking of the PVB to itself in successive winds on the core. The present invention is capable of rolling PVB-containing prelaminates either without an interleaving layer, or with an interleaving layer, such as polyethylene, between each PVB laminate layer to prevent fusion of the layers. Once interleaved with a release layer, PVB-containing laminates can be stored and shipped without refrigeration.

BRIEF DESCRIPTION OF THE DRAWINGS

The sole drawing FIGURE is a front elevation schematic illustrating the preferred apparatus of the invention and the material flow of PET, PVB, interleaving layer, and finished prelaminate through the apparatus.

DETAILED DESCRIPTION OF THE INVENTION

Abbreviations and Definitions

The following abbreviations and definitions are used throughout the specification and claims:

"carrier sheet"=the substrate onto which the metal-containing coating or solar-control coating is first deposited, preferably PET.

"coating"=one or more thin metallic, metal alloy and/or metallic oxide, nitride, carbide, silicide, boride, and/or sulfide layers of generally defined composition and thickness deposited upon a substrate.

"metal-containing"=containing a metal (such as, but not limited to, silver, gold, copper, nickel, indium, aluminum, titanium, tantalum, tin, chromium, manganese, zinc, and zirconium), a metal alloy, and/or metal and/or metal alloy oxides, nitrides, carbides, silicides, borides, and/or sulfides.

"PET"=polyethylene terephthalate and functional equivalents thereof.

"PVB"=polyvinyl butyral and functional equivalents thereof.

"solar control coating"=a coating (monolayer or multilayer) which has solar control properties (i.e. a coating which preferentially transmits only certain wavelengths of solar radiation).

"substrate"=the generally tacky substrate onto which the coating is transferred, preferably PVB.

As noted above, for purposes of brevity only, the following discussion is limited to a discussion of the deposition of a solar control coating upon a PVB substrate, followed by the lamination of the PVB layer bearing the solar-control coating to another, uncoated PVB layer. This is the preferred embodiment of the invention. However, the invention functions to dispose any coating upon substantially any flexible substrate having properties similar to that of PVB in the absence of a carrier sheet.

The Device to Manufacture the Coated PVB

The drawing figure depicts a schematic of the preferred embodiment of the apparatus to manufacture the composition of matter according to the invention. The figure illustrates the following components of the machine: a steel nip roll 1; a urethane nip roll 2; a first cooling roll 3; a second cooling roll 4; feed rolls 5 and 6; a tempering roll 7; parent PVB rolls 8 and 9; a parent PET roll 10; a waste PET uptake roll 10'; heaters 11; parent PVB static rolls 13, 14, 15, and 16; post-cooling static roll 17; a pre-uptake static rolls 18; slitter mandrel 20; daughter prelaminate rolls 21 and 22; interleaving rolls 23 and 24; cutter 25; light box 26; press roll 30, water cooler/heater 33 and water cooler 34.

With reference to the drawing, the apparatus of the invention functions as follows: A PET roll bearing a coating is loaded onto the parent PET roll 10 with the coating coming off the top of the roll; that is, with the coated side of the film facing toward the right side of the figure as the PET film descends toward press roll 30. The parent PET roll 10 is held back against the pull of the press roll 30 and feed roll 6 by means of an air operated brake mounted on the shaft of roll 10 (not shown). The tension-retarding force is preset by the operator, and diminishes as the roll gets smaller through the use of a sensor which measures the roll diameter.

In the preferred embodiment, the invention utilizes two rolls of PVB, which are mounted on parent PVB rolls 8 and 9. The invention can use only a single roll of PVB or as many as 4 or 5 rolls, depending upon the desired thickness of the finished product. A first roll of PVB is loaded on the parent PVB roll 8 and a second roll of PVB is loaded on the parent PVB roll 9. Generally, PVB has a rough side and a smooth side. It is essential that the smooth side of the PVB be presented to the opposing layer when laminating; therefore if the smooth side is "in" on roll 9, the roll will be loaded so that the PVB will come off the bottom of the roll, as shown in the figure. If the smooth side is "out," as on roll 8 of the figure, the roll will be loaded so that the PVB will come off the top of the roll. The PVB coming off roll 8 is threaded around static rolls 13 and 14; and then over the feed nip roll 5. The feed nip roll 5 is driven by a corresponding feed nip roll motor (not shown). The feed nip roll motor drives the feed nip roll 5 so as to unroll the PVB from roll 8 at a user selected rate in direct proportion to the line speed of the machine, and is variable within a limited range.

In similar fashion, a second roll of PVB is loaded on the parent PVB roll 9. The PVB from roll 9 is threaded over static rolls 15 and 16; and over the feed nip roll 6. The feed nip roll 6 is driven by a corresponding feed nip roll motor (not shown). The feed nip roll motor drives the feed nip roll 6 so as to unroll the PVB from roll 9 at a user selected rate in direct proportion to the line speed of the machine, and is variable within a limited range.

At the same time the PVB coming from roll 9 is passed over feed nip roll 6, it is contacted, under pressure provided by press roll 30 after being heated by heater 11, with a coated carrier sheet being drawn off of roll 10. The pressure exerted upon the coated PET substrate and the heated, tacky PVB by the concerted action of feed nip roll 6 and press roll 30 transfers the coating from the far cooler, non-tacky PET to the warm, very tacky PVB. After removal of the coating from the first (PET) substrate, the substrate is drawn away from the PVB at a sharp angle (which facilitates transfer of the coating) by uptake roll 10'.

As a general proposition, although not required, the feed nip roll motors which drive feed nip rolls 5 and 6 are set to provide the identical surface speed to ensure that the same amount of PVB is dispensed to uniformly encapsulate the coating deposited on the PVB coming off of roll 9.

As the two sheets of PVB exit the feed nip rollers 5 and 6, they are fed through a mated pair of rollers, a steel nip roller 1 and a flexible urethane nip roller 2. The combination of a steel nip roller and a flexible urethane nip roller (or a flexible roller of suitably flexible equivalent material) is critical to the operation of the invention because with this combination the invention will successfully manufacture a prelaminate which is substantially wrinkle-free. By substantially wrinkle-free, it is meant that the prelaminate formed by the invention is free of wrinkles to the extent that the prelaminate exhibits no optical defects due to wrinkling (or any other mechanical defect) when incorporated into a laminated window product. This is a substantial improvement from laminating machines known in the prior art.

As shown in the figure, several heaters 11 are strategically placed to uniformly heat the PVB substrate to a desired temperature. The heaters 11 do not physically touch either the PVB sheets or the PET sheet which pass through the device, but are disposed in close proximity to the PVB sheets to allow the heaters to heat the PVB. The PET is not heated by the heaters 11. The heaters 11 can be of any conventional design, although radiant electrical heaters are preferred. Such heaters are exceedingly well known in the art and can be purchased from several suppliers, such as Ogden, Tempco, Watlow, and Heraeus.

The heaters generally should be capable of uniformly heating a PVB surface to a temperature of between 120 ° F. and 250 ° F. and most preferably between 150 ° F. and 200° F.

The two layers of PVB are laminated together with the deposited coating in the middle as the two layers simultaneously pass through the steel nip roll 1 and the urethane nip roll 2. In order to control the machine precisely, it is preferred that the steel nip roll 1 and the urethane nip roll 2 are both belt driven by a main drive motor (not shown). The main drive motor turns the steel nip roll 1 urethane nip roll 2 toward each other, thus drawing the PVB through the steel nip roll 1 and the urethane nip roll 2 at user-selectable rate.

Another novel aspect of the invention is the incorporation of tempering roll 7 to uniformly heat or cool the urethane nip roller 2. The center of both the steel nip roll 1 and the tempering roll 7 is heated by electrically heated water which is pumped through each roll, to a user selected temperature, generally preferred to be less than the surface temperature of the PVB. The water is heated by the cooler/heater 33 and travels through conduits to the steel nip roll 1 and the tempering roll 7 and then back to the water cooler/heater 33. Contact friction drives the tempering roll 7 toward the urethane nip roller 2 so that heat or cold from the tempering roller 7 is uniformly transferred to the urethane nip roller. In this fashion, the surface temperature of the urethane nip roller 2 can be kept constant.

The pressure exerted upon the PVB as it passes through nip rollers 1 and 2 must be sufficient to fuse the layers together uniformly; the application of this pressure does not significantly alter the thickness of the resultant prelaminate (such non-uniformities being detrimental to the optical performance of the prelaminate). Both the pressure and the temperature across the entire length of rollers 1 and 2 can be maintained in uniformity at a user-selected temperature and pressure to ensure that the resultant product is free of wrinkles and has a uniform thickness and density.

The pressure applied by the nip rollers 1 and 2 is adjustable by adjusting the force applied on the rolls by use of actuation cylinders, which is well known in the art. The optimal pressure exerted by the rolls is empirically determined and is dependent, to a greater or lesser extent, on the temperature of the two nip rollers 1 and 2, the thickness of the substrates, the nature of the deposited coating, and the heat imparted to the incoming sheeting by heaters 11. Generally, the nip rollers 1 and 2 should be adjustable to provide an applied pressure of from 15 to 30 pounds of force per lineal inch of web to the sheeting as it passes between the nip rollers.

Immediately after the prelaminate exits the nip rollers 1 and 2, it is very warm and quite easily ruined by non-uniform tension. The prelaminate must be cooled in a controlled fashion and under controlled forces to ensure that the product does not delaminate, wrinkle, stretch, or otherwise suffer any mechanical deformations. This is done by passing the warm prelaminate over a series of cooling rolls to uniformly cool the prelaminate to the desired temperature and a series of idler rolls to maintain the proper tension as the cooled prelaminate is interleaved and rolled onto a core.

After exiting the nip rollers 1 and 2, the prelaminate is threaded around the cooling rolls 3 and 4 and under the post-cooling static roll 17. As shown in the sole drawing FIGURE the centers of cooling roll 3 and cooling roll 4 are maintained at a user-selected temperature, generally between 50 ° and 55 ° F. by the use of cold process water. The process water is generated in the water cooler 34 which pumps the cold water through suitable conduit to the cooling roll 3 and the cooling roll 4 and then back to the water cooler 34.

The laminate then passes over a light box 26. An operator of the device can stand near the light box and visually inspect the prelaminate as it passes over the light box. This allows for a quick and relatively easy gross inspection of the product prior to its being rolled onto a core or processed further (as into sheets).

The prelaminate is then passed by static roll 18, as shown in figure, and then under the slitter mandrel 20. At this point the prelaminate can be slit in the web direction to produce daughter rolls of narrower width than the parent rolls. Also, slitting can be omitted and the product simply rolled onto cores of the same length as the parent rolls and shipped in bulk. The cutter 25 is oriented as shown in the sole drawing to cut lengthwise only through the prelaminate so that a core of shorter length than the parent PET or PVB rolls can be used. This allows rolls of finished prelaminate to be cut to order at the same time the prelaminate is being rewound onto cores.

If the desired product is to be shipped in bulk, it can either be interleaved with a release layer or rolled onto cores without a release layer. If no release layer is used, PVB-containing prelaminates must be shipped under refrigeration or the rolls will irreversibly block and be ruined. If the product is to be shipped without a release layer, the cooled prelaminate is wrapped around one of daughter prelaminate rolls 21 or 22. The provision of two daughter prelaminate rolls is to facilitate the smooth slitting operation of the machine, as described below. Also, it must be borne in mind that for a bilayer product, the prelaminate product is at least twice as thick as the either of the parent PVB layers. Trilayer products will be larger still. Consequently, a shorter length of product which is a laminate of two or more layers results in a full-thickness daughter roll, as compared to the thinner PVB starting materials.

The daughter prelaminate rolls 21 and 22 are driven by corresponding daughter prelaminate roll rewind motors. These motors drive the rolls 21 and 22 in the direction shown in the figure.

If the prelaminate product is to be interleaved, which allows shipment of the product without refrigeration, a roll of polyethylene with the film coming off of the top is provided on one or both of parent PE rolls 23 and/or 24. Referring now to rolls 23 and 21, the operation being identical for rolls 24 and 22, the polyethylene film is wrapped around the core of the daughter prelaminate roll 21. Then, the prelaminate is passed from slitter mandrel 20 to the daughter prelaminate roll 21. Using this arrangement, the daughter prelaminate roll 21, driven by the corresponding daughter prelaminate roll rewind motor (not shown) in the direction shown in the sole drawing will wrap the finished prelaminate onto the daughter prelaminate roll 21, along with a layer of polyethylene between each layer of the prelaminate. In the same fashion as noted above, when the daughter prelaminate roll 21 is full, the prelaminate is cut by hand and is started on daughter prelaminate roll 22.

As a general proposition, the invention can be set to process sheeting material at a rate of about 5 to about 15 feet per minute. Improper speed can cause deformations mentioned earlier.

One critical functionality of the machine which distinguishes it from all other devices in the prior art is the use of mated steel and urethane nip rollers 1 and 2 respectively, to apply uniform heat and pressure to laminate the PVB layers together. Another novel aspect of the device is the use of a tempering roller 7 to uniformly heat or cool the urethane roller 2, as necessary.

The Coating to be Transferred to the Substrate from the Carrier Sheet:

Any metal-containing coating deposited upon the carrier sheet by any means now known or developed in the future can be utilized in the present invention, without limitation. Preferred coatings are solar-control coatings. As examples thereof, solar-control coatings which can be used in the present invention are described in the following U.S. patents, all of which are incorporated herein by reference: U.S. Pat. No. 4,413,877 to Suzuki et al.; U.S. Pat. No. 4,462,883 to Hart; U.S. Pat. No. 4,488,775 to Yamamoto; U.S. Pat. No. 4,497,700 to Groth et al.; U.S. Pat. No.

4,504,109 to Taga et al.; U.S. Pat. No. 4,546,050 to Amberger et al.; U.S. Pat. No. 4,548,691 to Dietrich et al.; U.S. Pat. No. 4,799,745 to Meyer et al.; U.S. Pat. No. 4,828,346 to Jacobson et al. U.S. Pat. No. 4,834,857 to Gillery; U.S. Pat. No. 4,847,158 to Gillery; U.S. Pat. No. 4,891,113 to Criss; U.S. Pat. No. 4,973,511 to Farmer et al.; U.S. Pat. No. 5,059,295 to Finley et al.; U.S. Pat. No. 5,071,206 to Hood et al.; U.S. Pat. No. 5,201,926 to Szczyrbowksi et al.; U.S. Pat. No. 5,279,722 to Szczyrbowski et al.; U.S. Pat. No. 5,494,743 to Woodard et al.; U.S. Pat. No. 5,563,734 to Wolfe et al.; U.S. Pat. No. 5,579,162 to Bjornard et al.; U.S. Pat. No. 5,584,902 to Hartig et al.; and U.S. Pat. No. 5,589,280 to Gibbons et al.

The coating to be applied on the PVB substrate is first deposited upon a non-tacky carrier sheet. The preferred carrier sheet is PET. The carrier sheet is not incorporated into the final product. The coating may be deposited directly upon the carrier sheet or may be deposited on top of a release layer deposited previously upon the carrier sheet. The use of a release layer on a PET carrier sheet is in direct opposition to prior art methods, wherein the PET, because it is incorporated into the final composition, is pre-treated so that the metal coating firmly adheres to the PET. The nature of the coating, the carrier sheet, and the release layer (if any) are not critical to the functionality of the invention.

The Preferred Coating for Use in the Invention

What follows is a description of the preferred coating for use in the present invention. This description in no way limits the scope of the invention described and claimed herein, which scope extends beyond the preferred embodiment.

In the preferred embodiment of the present invention, one or more thin metallic and/or metallic oxide and/or metallic nitride, and/or metallic carbide layers of generally defined composition and thickness are adhered to a thermoplastic or thermoset substrate which is not necessarily optically clear at the time the coating is adhered, but which is preferably optically clear when incorporated into a laminated glass product. The preferred substrate is PVB. In the preferred embodiment, the thicknesses of the various layers range from a minimum of about 15 Å to 1200 Å. Many methods exist and are well known for depositing such thin layers in a reproducible fashion. All such methods now known or developed in the future for the deposition of thin layers of metal or metal oxide upon a substrate can be used to fabricate the structures disclosed herein.

Among the methods commonly in use are vacuum deposition methods such as sputtering, magnetron-assisted sputtering, thermal evaporation, and the like; dipcoating, spray pyrolysis, and chemical vapor deposition. For an example of sputtering, see Gillery, U.S. Pat. No. 4,113,599, incorporated herein by reference. The method chosen to deposit the layers is not critical to the present invention, although magnetron sputtering is most preferred because it is suitable for large-volume manufacturing. Because these deposition methods are well known in the industry, they will not be described in any detail herein. It is preferred that the coating be deposited upon a carrier sheet, preferably PET, and then transferred to the substrate, as described hereinabove.

As a general proposition, it is desirable for a solar-control coating to have high light transmission across the visible spectrum, while minimizing IR transmissivity. Visible transmissivity is desirable because it provides good, clear visibility through the glass, without tinting or distortion. The thicknesses of the layers described herein below can be adjusted to alter, adjust, or otherwise optimize the visibility and IR reflectivity of the subject structure to suit any particular application. In any particular desired end use, the optimum thickness of the various layers to achieve a desired transmissivity profile can be determined empirically or roughly estimated based upon known models. For example, see Peter H. Berning (1983) "Principles of design of architectural coatings," *Applied Optics* 22 (24):4127–4141.

The preferred coating for use in the present invention is a selectively light-transmitting structure disposed directly on a substrate and in the absence of any carrier sheet. To fabricate the preferred structure, the following layers are deposited, in the order given, upon the carrier sheet:

(i) depositing a layer of indium oxide of from about 100 Å to 400 Å onto a substrate;

(ii) depositing a layer of silver of from about 30 Å to 120 Å onto the layer of indium oxide (i);

(iii) depositing a layer of indium of from about 15 Å to 60 Å onto the layer of silver (ii);

(iv) depositing a layer of indium oxide of from about 300 Å to 1200 Å onto the layer indium (iii);

(v) depositing a layer of silver of from about 60 Å to 240 Å onto the layer of indium oxide (iv);

(vi) depositing a layer of indium of from about 15 Å to 60 Å onto the layer of silver (v); and then (vii) depositing a layer of indium oxide of from about 100 Å to 400 Å onto the layer of indium (iv).

In the preferred structure, a final adhesive layer (viii) may optionally be deposited upon the indium oxide layer of (vii) so as to encourage secure adhesion between the layers deposited on the carrier sheet and the PVB substrate to which the layers are to be transferred. The adhesive layer (viii) may be any layer known to encourage adhesision to PVB and PVB-type materials, such as, but not limited to, titanium dioxide, chromium dioxide, silicon dioxide, and silicon nitride. Titanium dioxide is the preferred adhesive layer.

To make any of the other embodiments of the present invention as described above, using different metals or metal oxides, nitrides, carbides, etc. the desired layers are deposited upon a carrier sheet, and then transferred to the substrate as described above, to arrive at the desired coating applied directly to a substrate in the absence of a carrier sheet in the ultimate composition of matter.

The carrier sheet onto which the coating is deposited need not be visibly transparent. Any suitable rigid or flexible material (plastic, glass, metal, etc.) can be selected for the carrier sheet, so long as the chosen carrier sheet can withstand the rigors of the deposition method chosen and so long as the coating deposited upon the carrier sheet can be smoothly transferred from the carrier sheet to the substrate. Non-limiting examples of materials which can function as the carrier sheet include glass, polyethylene, polystyrene, saran, polyethylene terephthalate, polymethylmethacrylate, polycarbonate, etc. Polyethylene terephthalate is preferred from among these plastic substrates.

The carrier sheet may be surface-treated to enhance release of the coating from the carrier sheet at the desired time. Such surface treatments include, but are not limited to, coating the carrier sheet with a silicone or silicate release agent.

The metal oxide layer (i) described above is preferably indium oxide, but may be selected from the group consisting of indium oxide, titanium oxide, zinc oxide, tin oxide, yttrium oxide, erbium oxide, zirconium oxide, cerium oxide, tantalum oxide, hafnium oxide, and metal alloy oxides thereof.

The metal layer (ii) is preferably silver, but may be selected from the group consisting of silver, gold, copper, nickel, indium, aluminum, titanium, tantalum, chromium, manganese, zirconium, and alloys thereof.

The metal layer (iii) is preferably indium, but may be selected from the group consisting of silver, indium, aluminum, titanium, tantalum, chromium, manganese, zirconium, and alloys thereof, so long as the metal selected is different from the metal of layer (ii).

The metal oxide layer (iv) is preferably indium oxide, but may be selected from the group consisting of indium oxide, titanium oxide, zinc oxide, tin oxide, yttrium oxide, ytterbium oxide, zirconium oxide, cerium oxide, tantalum oxide, hafnium oxide, and metal alloy oxides thereof.

The metal layer (v) is preferably silver, but may be selected from the group consisting of silver, gold, copper, nickel, indium, aluminum, titanium, tantalum, chromium, manganese, zirconium, and alloys thereof.

The metal layer (vi) is preferably indium, but may be selected from the group consisting of silver, indium, aluminum, titanium, tantalum, chromium, manganese, zirconium, and alloys thereof, so long as the metal chosen is different from the metal of layer (v).

The metal oxide layer (vii) is preferably indium oxide, but may be selected from the group consisting of indium oxide, titanium oxide, zinc oxide, tin oxide, yttrium oxide, erbium oxide, zirconium oxide, cerium oxide, tantalum oxide, hafnium oxide, and metal alloy oxides thereof.

The following Example is provided as an illustration of the preferred embodiment of the invention. The Example does not limit the scope of the invention disclosed and claimed herein in any fashion.

EXAMPLE

PET (4 mils thick) was prepared for coating by washing and drying, and loaded onto an in-line D.C. planar magnetron sputtering apparatus.

A layer of indium oxide about 200 Å thick was reactively sputter deposited onto the substrate from an indium cathode in the presence of an oxygen atmosphere at $2.5 \times 10^{-3}$ torr.

A layer of silver about 60 Å thick was then sputter deposited onto the indium oxide from a silver cathode in the presence of an argon atmosphere at $3 \times 10^{-3}$ torr. A layer of indium about 30 Å was then sputtered onto the silver layer from an indium cathode in the presence of an argon atmosphere at $3 \times 10^{-3}$ torr.

A layer of indium oxide about 600 Å thick was then reactively sputter deposited onto the indium layer from an indium cathode in the presence of oxygen atmosphere at $2.5 \times 10^{-3}$ torr.

A layer of silver about 120 Å thick was then sputter deposited onto the indium oxide from a silver cathode in the presence of an argon atmosphere at $3 \times 10^{-3}$ torr. A layer of indium about 30 Å was then sputtered onto the silver layer from an indium cathode in the presence of an argon atmosphere at $3 \times 10^{-3}$ torr.

Lastly, indium oxide was reactively sputter deposited from an indium cathode in the presence of an oxygen atmosphere at $2.5 \times 10^{-3}$ torr to give an indium oxide layer about 200 Å thick.

The coated PET was then rolled and placed on roll 10 as shown in the figure, and transferred to a PVB web, as described above. The PVB web having the coating deposited upon it was then laminated to an uncoated PVB web, with the coating interspersed between the two layers of PVB.

The product so formed is then incorporated into a laminated glass product of the type normally used in the architectural and automobile industries.

What is claimed is:

1. A composition of matter comprising:
    a poly(vinylbutyral) substrate and;
    a coating adhered directly upon the substrate without the presence of a carrier sheet for the coating, the coating comprising at least one layer selected from the group consisting of metals, metal alloys, metal and metal alloy oxides, nitrides, carbides, silicides, borides, sulfides, and combinations thereof.

2. The composition of claim 1, wherein the coating is a solar-control coating.

3. The composition of claim 1, further comprising a second substrate of poly(vinylbutyral) adhered to the coating.

4. The composition of claim 1, wherein the coating comprises one or more layers selected from the group consisting of metals, metal oxides, metal carbides, metal nitrides, and combinations thereof.

5. The composition of claim 1, wherein the coating comprises, in order:
    (i) a layer of indium oxide;
    (ii) a layer of silver;
    (iii) a layer of indium;
    (iv) a layer of indium oxide;
    (v) a layer of silver;
    (vi) a layer of indium; and
    (vii) a layer of indium oxide.

6. The composition of claim 1, wherein the coating comprises, in order:
    (i) a layer of indium oxide of from about 100 Å to 400 Å thick;
    (ii) a layer of silver of from about 30 Å to 120 Å thick;
    (iii) a layer of indium of from about 15 Å to 60 Å thick;
    (iv) a layer of indium oxide of from about 300 Å to 1200 Å thick;
    (v) a layer of silver of from about 60 Å to 240 Å thick;
    (vi) a layer of indium of from about 15 Å to 60 Å thick; and
    (vii) a layer of indium oxide of from about 100 Å to 400 Å thick.

7. A composition of matter produced by:
    depositing a coating upon a carrier sheet, the coating comprising at least one layer selected from the group consisting of metals, metal alloys, metal and metal alloy oxides, nitrides, carbides, silicides, borides, sulfides, and combinations thereof; and then
    transferring the coating from the carrier sheet to a poly(vinylbutyral) substrate, thereby yielding a coating adhered directly to the substrate in the absence of a carrier sheet.

8. The composition of claim 7, wherein the coating is a solar-control coating.

9. The composition of claim 7, wherein the coating is deposited upon the carrier sheet by sputter deposition.

10. The composition of claim 7, wherein the carrier sheet is poly(ethyleneterephthalate).

11. The composition of claim 7, wherein the coating comprises one or more layers selected from the group consisting of metals, metal oxides, metal nitrides, metal carbides, and combinations thereof.

12. The composition of claim 7, wherein the coating is deposited upon the carrier sheet as follows:
    (i) a layer of indium oxide is deposited upon the carrier sheet;

(ii) a layer of silver is deposited upon layer (i);

(iii) a layer r of indium is deposited upon layer (ii);

(iv) a layer of indium oxide is deposited upon layer (iii);

(v) a layer of silver is deposited upon layer (iv);

(vi) a layer of indium is deposited upon layer (v); and then (vii) a layer of indium oxide is deposited upon layer (vi).

13. The composition of claim 12, further comprising an adhesive layer (viii) deposited upon layer (vii).

14. The composition of claim 13, wherein the adhesive layer is selected from the group consisting of titanium dioxide, chromium dioxide, silicon dioxide, and silicon nitride.

15. The composition of claim 7, wherein the coating is deposited upon the carrier sheet as follows:

(i) a layer r of indium oxide of from about 100 Å to 400 Å thick is deposited upon the carrier sheet;

(ii) a layer of silver of from about 30 Å to 120 Å thick is deposited upon layer (i);

(iii) a layer of indium of from about 15 Å to 60 Å thick is deposited upon layer (ii);

(iv) a layer of indium oxide of from about 300 Å to 1200 Å thick is deposited upon layer (iii);

(v) a layer of silver of from about 60 Å to 240 Å thick is deposited upon layer (iv);

(vi) a layer of indium of from about 15 Å to 60 Å thick is deposited upon layer (v); and then (vii) a layer of indium oxide of from about 100 Å to 400 Å thick is deposited upon layer (vi).

* * * * *